(12) United States Patent
Salman et al.

(10) Patent No.: US 7,609,493 B1
(45) Date of Patent: Oct. 27, 2009

(54) ESD PROTECTION CIRCUIT AND METHOD FOR LOWERING CAPACITANCE OF THE ESD PROTECTION CIRCUIT

(75) Inventors: Akram A. Salman, Sunnyvale, CA (US); Stephen G. Beebe, Los Altos, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 663 days.

(21) Appl. No.: 11/027,980

(22) Filed: Jan. 3, 2005

(51) Int. Cl.
*H02H 9/00* (2006.01)
*H02H 3/20* (2006.01)
*H02H 9/04* (2006.01)
*H02H 3/22* (2006.01)
*H01C 7/12* (2006.01)
*H02H 1/00* (2006.01)
*H02H 9/06* (2006.01)

(52) U.S. Cl. ............... 361/56; 361/91.1; 361/111; 361/118

(58) Field of Classification Search ............ None
See application file for complete search history.

(56) References Cited

U.S. PATENT DOCUMENTS

| | | | |
|---|---|---|---|
| 5,610,790 A | 3/1997 | Staab et al. | |
| 6,114,197 A | 9/2000 | Hsu | |
| 6,232,163 B1 | 5/2001 | Voldman et al. | |
| 6,531,741 B1 | 3/2003 | Hargrove et al. | |
| 6,653,670 B2 | 11/2003 | Ker et al. | |
| 6,762,918 B2 * | 7/2004 | Voldman | 361/91.1 |
| 6,898,060 B2 * | 5/2005 | Juliano et al. | 361/56 |
| 2003/0139024 A1 | 7/2003 | Ker et al. | |
| 2004/0105203 A1 | 6/2004 | Ker et al. | |
| 2004/0264080 A1 * | 12/2004 | Yang et al. | 361/56 |

* cited by examiner

*Primary Examiner*—Albert W Paladini
*Assistant Examiner*—Dharti Patel
(74) *Attorney, Agent, or Firm*—Farjami & Farjami LLP

(57) ABSTRACT

An electrostatic discharge (ESD) protection circuit and a method for reducing capacitance in the ESD protection circuit. A pair of gated diodes are connected in series, wherein the anode of one of the gated diodes is coupled to a lower voltage supply node and the cathode the other gated diode is connected to the upper voltage supply node. The commonly connected anode and cathode of the series connected gated diodes are connected to an input/output pad and to receiver and driver circuitry. The gates of the gated diodes are connected together. A gate biasing circuit is connected to the gates of the gated diodes. The gate biasing circuit applies a voltage to the gates of the gated diodes and depletes their channel regions of charge carriers, which lowers the capacitances of each gate diode.

12 Claims, 2 Drawing Sheets

ESD PROTECTION CIRCUIT AND METHOD FOR LOWERING CAPACITANCE OF THE ESD PROTECTION CIRCUIT

FIELD OF THE INVENTION

The present invention relates, in general, to semiconductor components and, more particularly, to the protection of semiconductor components from transient electrical signals.

BACKGROUND OF THE INVENTION

Semiconductor component manufacturers typically include structures for protecting their devices against failure caused by large transient electrical stimuli. When the stimulus is an electrostatic discharge (ESD) event, manufacturers generally incorporate protection structures that account for failure mechanisms attributed to the Human Body Model (HBM) and to the Charged Device Model (CDM). The Human Body Model simulates electrostatic discharge from a human body to a semiconductor device that is sensitive to the discharge event. Here, charge accumulated on the human body discharges to the semiconductor device. The Charged Device Model simulates the discharge of charge accumulated on the semiconductor device itself during the assembly process. When these charged devices contact metal objects, a discharge event occurs which is short in duration accompanied by peak currents capable of exceeding ten amperes.

To protect against these events, semiconductor component manufacturers incorporate ESD protection structures into their components. They are coupled to input and output pads of the semiconductor devices to prevent device failure due to positive and negative voltage excursions. To provide maximal ESD protection, it is desirable to increase the discharge path for ESD induced current by making the ESD protection structures large. However, large ESD protection structures occupy large areas on the semiconductor substrate, which increases the costs associated with manufacturing the semiconductor component. In addition, making the ESD protection structures large increases the capacitance associated with the input and output pads to which they are coupled. In high frequency applications, increasing the capacitance of the ESD protection structure increases the Resistance-Capacitance (RC) time constant of the pin coupled to the bond pad, which makes the devices unacceptably slow.

Accordingly, it would be advantageous to have an ESD protection structure with reduced capacitance during normal operation and a method for lowering the capacitance of the ESD protection structure. It would be of further advantage for the method and ESD protection structure to be cost efficient.

SUMMARY OF THE INVENTION

The present invention satisfies the foregoing need by providing an electrostatic discharge (ESD) protection circuit whose capacitance can be modulated to provide high frequency performance or increase the semiconductor area occupied by the ESD protection circuit. In accordance with one aspect, the ESD protection circuit comprises a first gated diode having a cathode, an anode, and a gate, wherein the cathode is coupled to a first voltage supply rail. A biasing circuit is coupled to the gate of the first gated diode.

In accordance with another aspect, the present invention comprises a capacitance modulation circuit suitable for use with electrostatic discharge (ESD) protection circuitry. The circuit includes first and second gated diodes, each having an anode, a cathode, and a gating electrode. The anode of the first gated diode is coupled to the cathode of the second gated diode. The gating electrodes of the first and second gated diodes are coupled together to form a capacitance control node. A first current carrying electrode of a first insulated gate field effect transistor is coupled to the capacitance control node and the gate of the first insulated gate field effect transistor is coupled to a first current carrying electrode of a second field effect transistor.

In accordance with yet another aspect, the present invention comprises a method for changing capacitance of an electrostatic discharge protection network coupled to an integrated circuit. The electrostatic discharge protection network has at least one channel region. The capacitance is changed by depleting charge carriers from the at least one channel region to form a depletion capacitance in the at least one channel region that is in series with a diode junction capacitance of the gated electrostatic discharge protection network. The depletion capacitance is lower than the diode junction capacitance of the gated electrostatic discharge protection network.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Generally, the present invention provides a means for changing the capacitance associated with an electrostatic discharge (ESD) protection network coupled to an input/output (I/O) pad of an integrated circuit. In accordance with one aspect of the present invention, a capacitance modulation circuit is provided in which a biasing circuit is coupled to the ESD protection network. The combination of the gate biasing circuit and the ESD protection network form an ESD protection circuit. When the integrated circuit is operating under normal conditions, the biasing circuit decreases the capacitance of the electrostatic discharge protection network, thereby lowering the resistance-capacitance (RC) time constant of the input/output pad and increasing the frequencies the input/output pad can support. Preferably, the ESD protection network comprises at least one gated diode. Further, the biasing circuit decouples the gates of the gated diodes from the power supply rails thereby preventing damage to the gates of the gated diodes during an ESD event.

Figure 1:
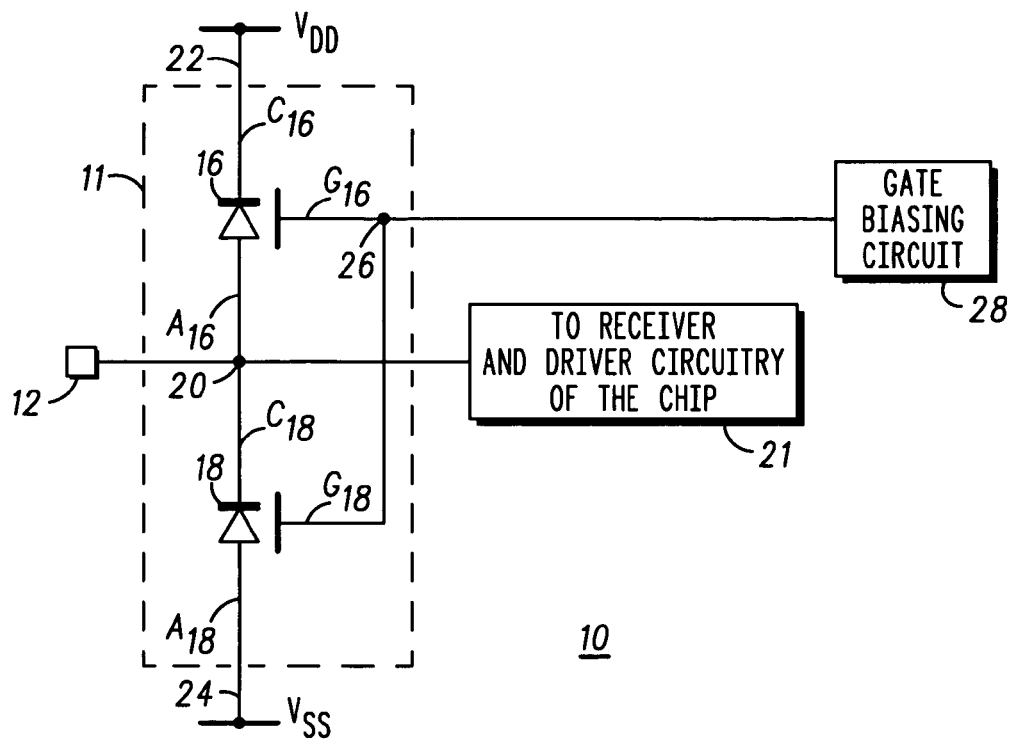
FIG. 1 is a schematic diagram of an ESD protection circuit having a gate biasing circuit coupled to an ESD protection network in accordance with an embodiment of the present invention.

FIG. 1 is a schematic diagram of an ESD protection circuit 10 in accordance with an embodiment of the present invention. Electrostatic discharge protection circuit 10 is suitable for manufacturing as an integrated circuit (IC) using conventional monolithic IC processes. What is shown in FIG. 1 is an I/O pad 12, a gated diode 16, and a gated diode 18 coupled to an I/O node 20. Gated diodes 16 and 18 cooperate to form an ESD protection network. Gated diode 16 has a control or gating electrode ($G_{16}$), a cathode ($C_{16}$) connected to a voltage supply node 22, and an anode ($A_{16}$). Gated diode 18 has an anode ($A_{18}$) connected to voltage supply node 24, a cathode ($C_{18}$) connected to anode $A_{16}$ to form I/O node 20, and a control or gating electrode ($G_{18}$) connected to the control electrode $G_{16}$ of gated diode 16 to form a node 26. Node 26 is also referred to as a gating node or a capacitance control node. A gate biasing circuit 28 is connected to control electrodes $G_{16}$ and $G_{18}$ of gated diodes 16 and 18, respectively, at node 26. I/O pad 12 and receiver and driver circuitry 21 are also connected to I/O node 20. For the sake of clarity, receiver and driver circuitry of the integrated circuit are shown in block diagram form and identified by reference number 21.

Voltage supply node 22 is coupled for receiving a source of operating potential such as, for example, $V_{DD}$, and voltage supply node 24 is coupled for receiving a source of operating potential such as, for example, $V_{SS}$. Voltage supply nodes 22 and 24 are also referred to as voltage supply rails. By way of example, voltage $V_{DD}$ is five volts and voltage $V_{SS}$ is zero volts. It should be understood that the voltages for $V_{DD}$ and $V_{SS}$ are not limited to being five volts and zero volts, respectively, but can be other suitable voltages.

Figure 2:
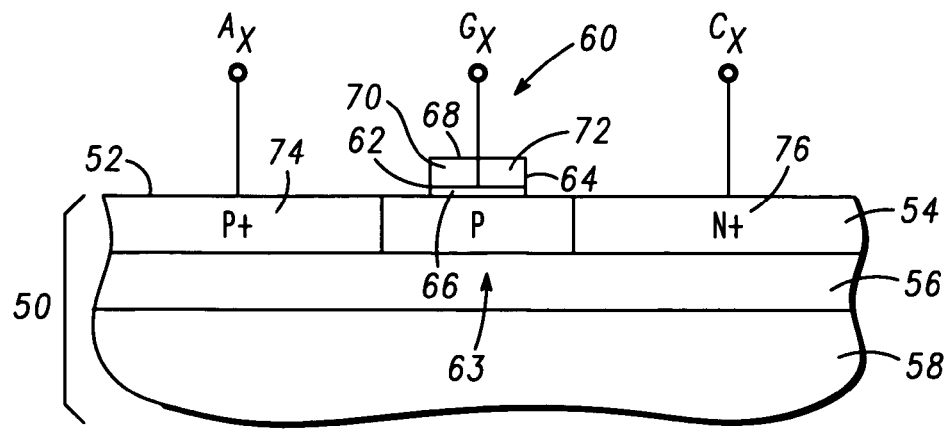
FIG. 2 is a cross-sectional side view of a gated diode for use with a gate biasing circuit in accordance with an embodiment of the present invention.

Referring now to FIG. 2, a cross-sectional side view of a gated diode such as gated diodes 16 and 18 is illustrated. What is shown in FIG. 2 is a Semiconductor-On-Insulator (SOI) substrate 50 having a substrate surface 52. SOI substrate 50 comprises a layer of P-type semiconductor material 54 disposed on a layer of dielectric material 56 which is disposed on a semiconductor material 58. Preferably, layer of semiconductor material 54 has a thickness ranging from that of a monolayer of silicon to about 1,000 Angstroms (Å) and dielectric layer 56 has a thickness ranging from about 500 Å to about 5,000 Å. Substrate surface 52 is also referred to as a top surface of the substrate or an active surface. Techniques for forming an SOI structure are known to those skilled in the art.

Still referring to FIG. 2, a gate structure 60 having sidewalls 62 and 64 is formed on substrate surface 52. Gate structure 60 comprises a gate dielectric material 66 disposed on substrate surface 52 and a gate polysilicon material 68 disposed on gate dielectric material 66. Gate polysilicon has a doped region 70 of P-type conductivity adjacent a doped region 72 of N-type conductivity. A gate electrode ($G_X$) contacts gate polysilicon material 68. A heavily doped region 74 of P-type impurity material is formed in a portion of P-type semiconductor material 54 adjacent side 62 and serves as an anode and a heavily doped region 76 of N-type impurity material is formed in a portion of P-type semiconductor material 54 adjacent side 64 and serves as a cathode. An anode electrode $A_X$ contacts anode region 74 and a cathode electrode $C_X$ contacts cathode region 76. The portion of substrate semiconductor layer 54 between doped regions 74 and 76 and under gate structure 60 serves as a channel region 63. It should be understood that the subscript "X" has been used with the reference identifiers G, A, and C for the gate, anode and cathode electrodes, respectively. When referring to gated diode 16, the "X" is replaced by the number 16. Likewise, when referring to gated diode 18, the "X" is replaced by the number 18.

Although gated diodes 16 and 18 have been described as having a P-type body, this is not a limitation of the present invention. Gated diodes 16 and 18 can also have an N-type body in which heavily doped regions such as regions 74 and 76 are formed. Further, gated diodes 16 and 18 are not limited to being manufactured from an SOI substrate, but can be manufactured from any suitable semiconductor substrate including a bulk silicon substrate.

In operation, gate biasing circuit 28 of FIG. 1 provides a gate bias voltage at node 26. The gate bias voltage depletes channel region 63 (shown in FIG. 2) of charge carriers, thereby creating a depletion capacitance in series with the parasitic diode junction capacitance. Because the depletion capacitance is in series with the diode junction capacitance and is much smaller than the diode junction capacitance, the overall capacitance is reduced. Thus, depleting the channel region of charge carriers reduces the capacitance of gated lateral diodes 16 and 18. An advantage of reducing the capacitance per unit area is that ESD protection structures, such as ESD protection network 11, can be made larger without impacting the performance of the I/O circuit while providing additional protection against an ESD event. In addition, for designs in which ESD protection network 11 has a substantially constant area, the total capacitance of the ESD protection circuit, e.g., ESD protection circuit 10, will be lower, thereby allowing I/O pad 12 to handle higher frequency electrical signals.

Figure 3:
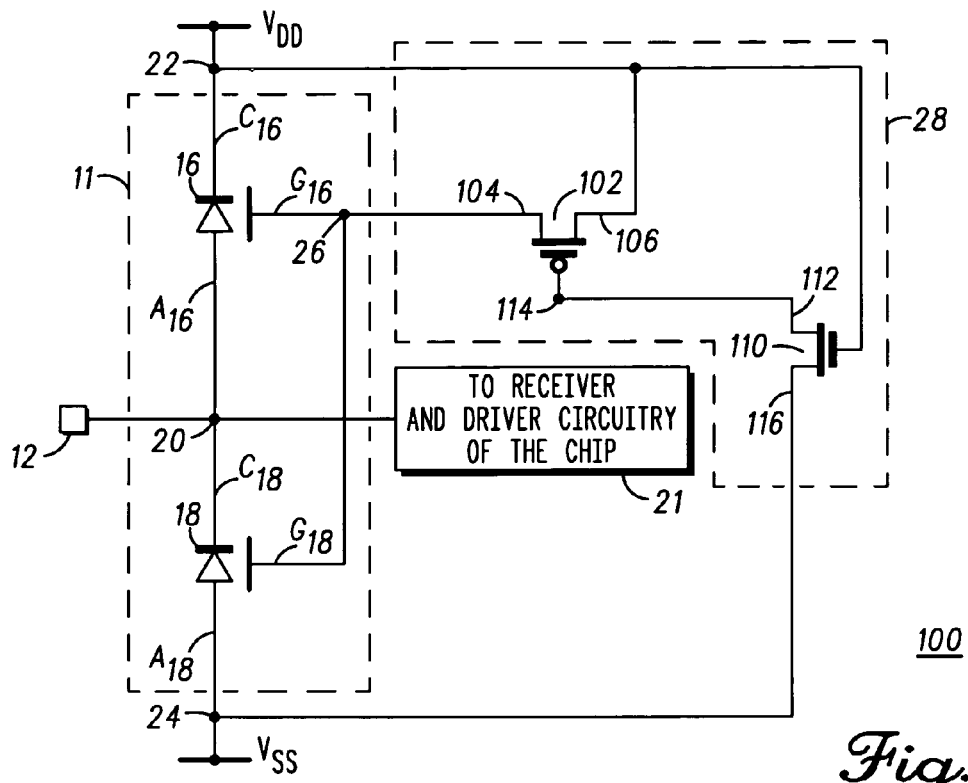
FIG. 3 is a schematic diagram of an ESD protection circuit in accordance with another embodiment of the present invention.

Referring now to FIG. 3, a schematic diagram of an electrostatic discharge (ESD) protection circuit 100 in accordance with another embodiment of the present invention is illustrated. Electrostatic discharge protection circuit 100 is suitable for manufacturing as an integrated circuit (IC) using conventional monolithic IC processes. What is shown in FIG. 3 is I/O pad 12, gated diode 16, gated diode 18, and receiver and driver circuitry 21 coupled at I/O node 20. These structures were described with reference to FIG. 1. A P-channel insulated gate field effect transistor 102 has a current carrying electrode 104 connected to control electrodes $G_{16}$ and $G_{18}$ of gated diodes 16 and 18, respectively, at node 26, a current carrying electrode 106 connected to voltage supply node 22, and a gate electrode. An N-channel insulated gate field effect transistor 110 has a current carrying electrode 112 connected to the gate electrode of transistor 102 at node 114, a current carrying electrode 116 connected to voltage supply node 24, and a gate electrode connected to voltage supply node 22. Transistors 102 and 104 cooperate to form diode gate biasing circuit 28 shown in FIG. 1.

In operation, voltage signals, $V_{DD}$ and $V_{SS}$, are supplied to ESD protection circuit 100, turning on transistor 110 and pulling the voltage appearing at node 114 to a logic low voltage level. The logic low voltage level appearing at node 114 is supplied to the gate electrode of transistor 102. Current carrying electrode 106 is connected to voltage supply node 22, which is coupled for receiving supply voltage $V_{DD}$. Because the voltage supplied to the gate electrode of transistor 102 is at a logic low voltage level, transistor 102 turns on, thereby transferring voltage $V_{DD}$ to current carrying electrode 104 and to node 26 to which electrode 104 is connected. Thus, transistor 102 serves as a pass gate. By way of example, voltage $V_{DD}$ is five volts and voltage $V_{SS}$ is zero volts. It should be understood that the voltages for $V_{DD}$ and $V_{SS}$ are not limited to being five volts and zero volts, respectively, but can be other suitable voltages.

Like the operation of ESD protection circuit 10 described with reference to FIG. 1, voltage $V_{DD}$ appearing at node 26 depletes channel region 63 (shown in FIG. 2) of charge carriers, thereby creating a depletion capacitance in series with the parasitic diode junction capacitance. Because the depletion capacitance is in series with the diode junction capacitance and is much smaller than the diode junction capacitance, the overall capacitance is reduced. Thus, depleting the channel region of charge carriers reduces the capacitance of gated lateral diodes 16 and 18. Like ESD protection circuit 10, an advantage of reducing the capacitance per unit area is that ESD protection structures, such as ESD protection network 11, can be made larger without impacting the performance of the I/O circuit while providing additional protection against an ESD event. For designs in which ESD protection network 11 has a substantially constant area, the total capacitance of the ESD protection circuit, e.g., ESD protection circuit 100, will be lower, thereby allowing I/O pad 12 to handle higher frequency electrical signals.

Figure 4:
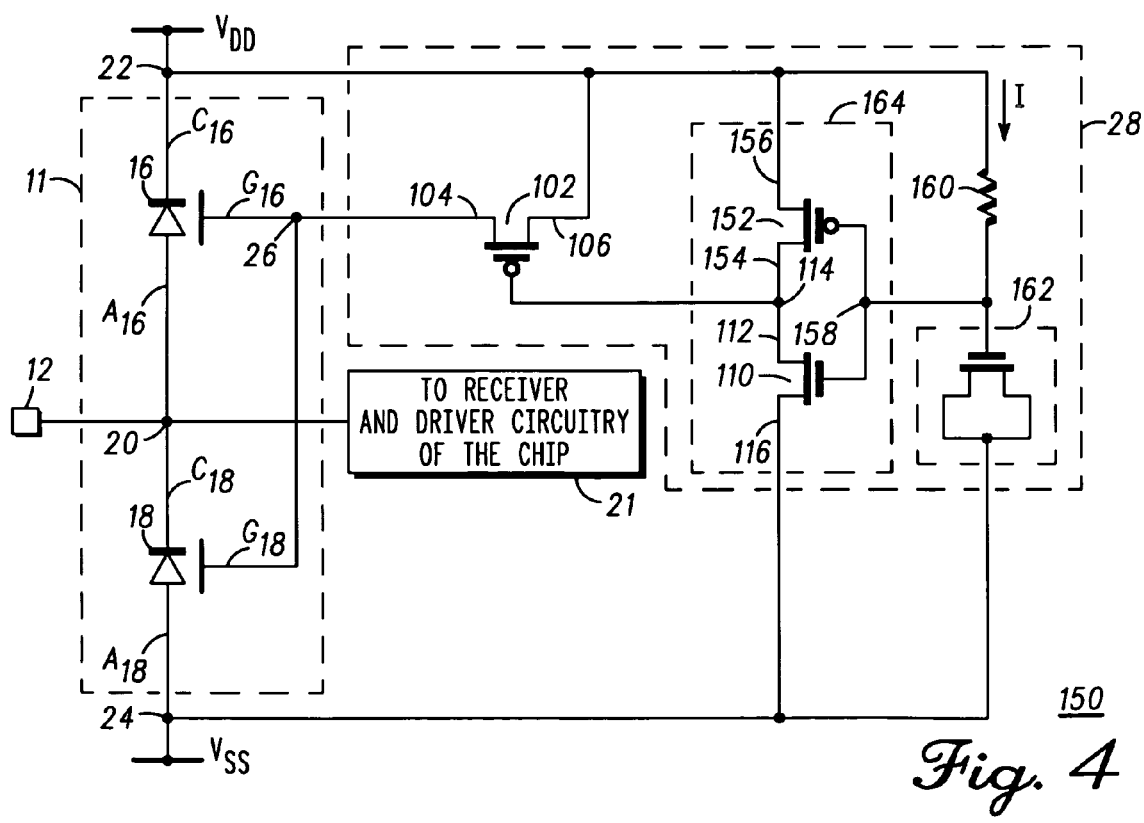
FIG. 4 is a schematic diagram of an ESD protection circuit in accordance with yet another embodiment of the present invention.

Referring now to FIG. 4, a schematic diagram of an electrostatic discharge (ESD) protection circuit 150 in accordance with another embodiment of the present invention is illustrated. Electrostatic discharge protection circuit 150 is suitable for manufacturing as an integrated circuit (IC) using conventional monolithic IC processes. Like electrostatic discharge protection circuit 100, electrostatic discharge protection circuit 150 includes gated diodes 16 and 18, P-channel insulated gate field effect transistor 102, and N-channel insulated gate field effect transistor 110. It should be noted that in FIG. 4, the control electrode of N-channel insulated gate field effect transistor 110 is not directly connected to voltage supply node 22 as in FIG. 3. ESD protection circuit 150 further includes a P-channel insulated gate field effect transistor 152 having a current carrying electrode 154 connected to a current carrying electrode 112 of N-channel insulated gate field effect transistor 110 at node 114 and a current carrying electrode 156 coupled to voltage supply node 22. A control electrode of transistor 110 is connected to the control electrode of transistor 152 forming a node 158. Transistors 110 and 152 are connected together to form an inverter 164 having an input node 158 and an output node 114. Node 158 is coupled to voltage supply node 22 through a resistor 160 and to voltage supply node 24 through a capacitor 162. Preferably, capacitor 162 is a transistor configured as a capacitor. Resistor 160 and capacitor 162 cooperate to form an RC circuit. Thus, an RC circuit is connected to input node 158 of inverter circuit 164.

In operation, voltage signals, $V_{DD}$ and $V_{SS}$, are supplied to ESD protection circuit 150, creating a current I that flows through resistor 160 and capacitor 162 thereby charging capacitor 162. Once capacitor 162 is charged, current I stops flowing, leaving a voltage substantially equal to voltage $V_{DD}$ at node 158. Transistors 110 and 156 cooperate to form an inverter 164, wherein node 158 serves as an input node and node 114 serves as an output node. Thus, when a logic high voltage level such as voltage $V_{DD}$ appears at node 158, a logic low voltage level appears at node 114. By way of example, voltage $V_{DD}$ is five volts and voltage $V_{SS}$ is zero volts. It should be understood that the voltages for $V_{DD}$ and $V_{SS}$ are not limited to being five volts and zero volts, respectively, but can be other suitable voltages.

Like the operation of the ESD protection circuits 10 and 100 described with reference to FIGS. 1 and 3, respectively, voltage $V_{DD}$ appearing at node 26 depletes channel region 63 (shown in FIG. 2) of charge carriers, thereby creating a depletion capacitance in series with the parasitic diode junction capacitance. Because the depletion capacitance is in series with the diode junction capacitance and is much smaller than the diode junction capacitance, the overall capacitance is reduced. Thus, depleting the channel region of charge carriers reduces the capacitance of gated lateral diodes 16 and 18. Like ESD protection circuits 10 and 100, an advantage of reducing the capacitance per unit area is that ESD protection structures, such as ESD protection network 11, can be made larger without impacting the performance of the I/O circuit while providing additional protection against an ESD event. For designs in which ESD protection network 11 has a substantially constant area, the total capacitance of the ESD protection circuit, e.g., ESD protection circuit 150, will be lower, thereby allowing I/O pad 12 to handle higher frequency electrical signals.

In the embodiment shown in FIG. 4, input node 158 of inverter 164 is connected to an RC circuit that can detect an ESD event on I/O pad 12 or on supply node 22 or supply node 24. In response, ESD protection circuit 150 opens pass gate 102, causing node 26 (i.e., gates $G_{16}$ and $G_{18}$ of gated diodes 16 and 18, respectively) to float, which decouples the gated-diode gates from the supply and prevents overvoltage stress, thereby ensuring adequate ESD protection without damaging gated diodes 16 and 18.

Although the present description has described biasing circuitry for gated diodes having P-type body regions, this is not a limitation of the present invention. The gated diodes may have N-type body regions. In the case of gated diodes with N-type body regions, the biasing circuits should apply a negative voltage to node 26 (i.e., gates $G_{16}$ and $G_{18}$ of gated diodes 16 and 18, respectively).

By now it should be appreciated that an ESD protection network having a reduced capacitance during normal operation and a method for reducing the capacitance have been provided. In accordance with the present invention, when the integrated circuit is powered-up, a biasing circuit biases the gated diode ESD protection network to deplete its channel region of charge carriers. Depleting the channel region of charge carriers decreases its capacitance. Because the capacitance of the channel region is in series with the capacitance of the diode junction, the overall capacitance of the gated diode is decreased. An advantage of decreasing the capacitance of the gated diode ESD protection network is that it allows transmission of higher frequency signals through the I/O pads connected to the gated diode ESD protection network. Another advantage is that the decreased capacitance gives designers the option to make larger ESD protection devices. In addition, the ESD protection circuit has a lower capacitance during normal operation, while preventing damage to the gate oxide of the gated diodes because the gates float during an ESD event. Normal operation is when the integrated circuit containing ESD protection circuits is mounted in a socket, powered up and receiving and transmitting electrical signals in the absence of unexpectedly high current or voltage surges, i.e., in the absence of an ESD event.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. An electrostatic discharge (ESD) protection circuit, comprising:

first and second voltage supply rails;

a first gated diode having an anode, a cathode, and a gate, the cathode coupled to the first voltage supply rail; and a biasing circuit directly connected to the gate, wherein the biasing circuit comprises:

a first insulated gate field effect transistor having a control electrode, a first current carrying electrode, and a second current carrying electrode, the first current carrying electrode coupled to the gating node and the second current carrying electrode coupled the first voltage supply rail; and a second insulated gate field effect transistor having a control electrode, a first current carrying electrode, and a second current carrying electrode, the first current carrying electrode coupled to the control electrode of the first insulated gate field effect transistor, the second current carrying electrode coupled to the second voltage supply rail, and the control electrode coupled to the first voltage supply rail.

2. The ESD protection circuit of claim 1, wherein the first insulated gate field effect transistor is a P-channel insulated gate field effect transistor and the second insulated gate field effect transistor is an N-channel insulated gate field effect transistor.

3. A capacitance modulation circuit suitable for use with electrostatic discharge (ESD) protection circuitry, comprising:
 a first gated diode having an anode, a cathode, and a gating electrode;
 a second gated diode having an anode, a cathode, and a gating electrode, the cathode coupled to the anode of the first gated diode, and the gating electrode of the second gated diode coupled to the gating electrode of the first gated diode to form a capacitance control node;
 a first insulated gate field effect transistor having a control electrode and first and second current carrying electrodes, the first current carrying electrode directly connected to the capacitance control node; and
 a second insulated gate field effect transistor having a control electrode and first and second current carrying electrodes, the first current carrying electrode coupled to the control electrode of the first insulated gate field effect transistor.

4. The capacitance modulation circuit of claim 3, wherein the first insulated gate field effect transistor is a P-channel insulated gate field effect transistor and the second insulated gate field effect transistor is an N-channel insulated gate field effect transistor.

5. The capacitance modulation circuit of claim 3, further including:
 a third insulated gate field effect transistor having a control electrode and first and second current carry electrodes, the control electrode coupled to the control electrode of the second insulated gate field effect transistor to form an input node, and the first current carrying electrode coupled to the first current carrying electrode of the second insulated gate field effect transistor;
 a resistor coupled to the input node; and
 a capacitor coupled to the input node.

6. The capacitance modulation circuit of claim 5, wherein the first and third field effect transistors are P-channel insulated gate field effect transistors and the second field effect transistor is an N-channel insulated gate field effect transistor.

7. The capacitance modulation circuit of claim 3, wherein the first gated diode and the second gated diode have P-type bodies.

8. The capacitance modulation circuit of claim 3, wherein the first gated diode and the second gated diode have N-type bodies.

9. A method for changing capacitance of an electrostatic discharge protection network coupled to an integrated circuit, comprising the steps of:
 providing the gated electrostatic discharge protection network between an Input-Output pad and a first source of operating potential and between the Input-Output pad and a second source of operating potential, wherein the gated electrostatic discharge protection network has at least one channel region; and
 depleting charge carriers from the at least one channel region to form a depletion capacitance in the at least one channel region that is in series with a diode junction capacitance of the gated electrostatic discharge protection network, wherein the depletion capacitance is lower than the diode junction capacitance of the gated electrostatic discharge protection network.

10. The method of claim 9, wherein the step of depleting charge carriers comprises applying an electrical signal to the gated electrostatic discharge protection network.

11. The method of claim 10, wherein the step of applying the electrical signal to the gated electrostatic discharge protection network comprises applying the electrical signal when powering on the integrated circuit.

12. The method of claim 10, wherein the step of applying the electrical signal to the gated electrostatic discharge protection network comprises coupling a biasing circuit to the gated electrostatic discharge protection network.

* * * * *